United States Patent [19]

Sauer et al.

[11] 4,255,815
[45] Mar. 10, 1981

[54] ELECTRONIC SWITCHING FOR AM-FM RADIO

[75] Inventors: Don R. Sauer; William A. Cocke, both of San Jose, Calif.

[73] Assignee: National Semiconductor Corporation, Santa Clara, Calif.

[21] Appl. No.: 947,981

[22] Filed: Oct. 2, 1978

[51] Int. Cl.³ .......................... H04B 1/26; H03D 5/00
[52] U.S. Cl. ......................................... 455/143; 329/1; 455/189; 455/266
[58] Field of Search ............................... 325/315–317, 325/458, 459, 485, 302, 427, 424; 455/142–144, 180, 188, 189, 140, 266, 267; 329/1

[56] References Cited

U.S. PATENT DOCUMENTS

| | | | |
|---|---|---|---|
| 2,133,816 | 10/1938 | Holst | 325/424 |
| 2,491,809 | 12/1949 | Fyler | 325/316 |
| 3,243,708 | 3/1966 | Manson | 325/317 |
| 3,628,146 | 12/1971 | Beckman | 325/315 |

Primary Examiner—Marc E. Bookbinder
Attorney, Agent, or Firm—Gail W. Woodward; James A. Sheridan

[57] ABSTRACT

An integrated circuit, when operated from a simple single-pole-double throw switch, performs all of the functions required to switch modes in an FM-AM radio. The radio frequency circuits are switched directly and, in response to the AM oscillator circuit state, electronic switching is employed to switch the FM limiter, AM mixer, and audio amplifier. In the FM mode, the audio amplifier has high fidelity wide band response. In the AM mode, the audio amplifier is switched to operate with a reduced bandwidth. Thus, the audio amplifier does not produce signal components that can be picked up by the AM antenna, where they are interpreted as noise.

1 Claim, 2 Drawing Figures

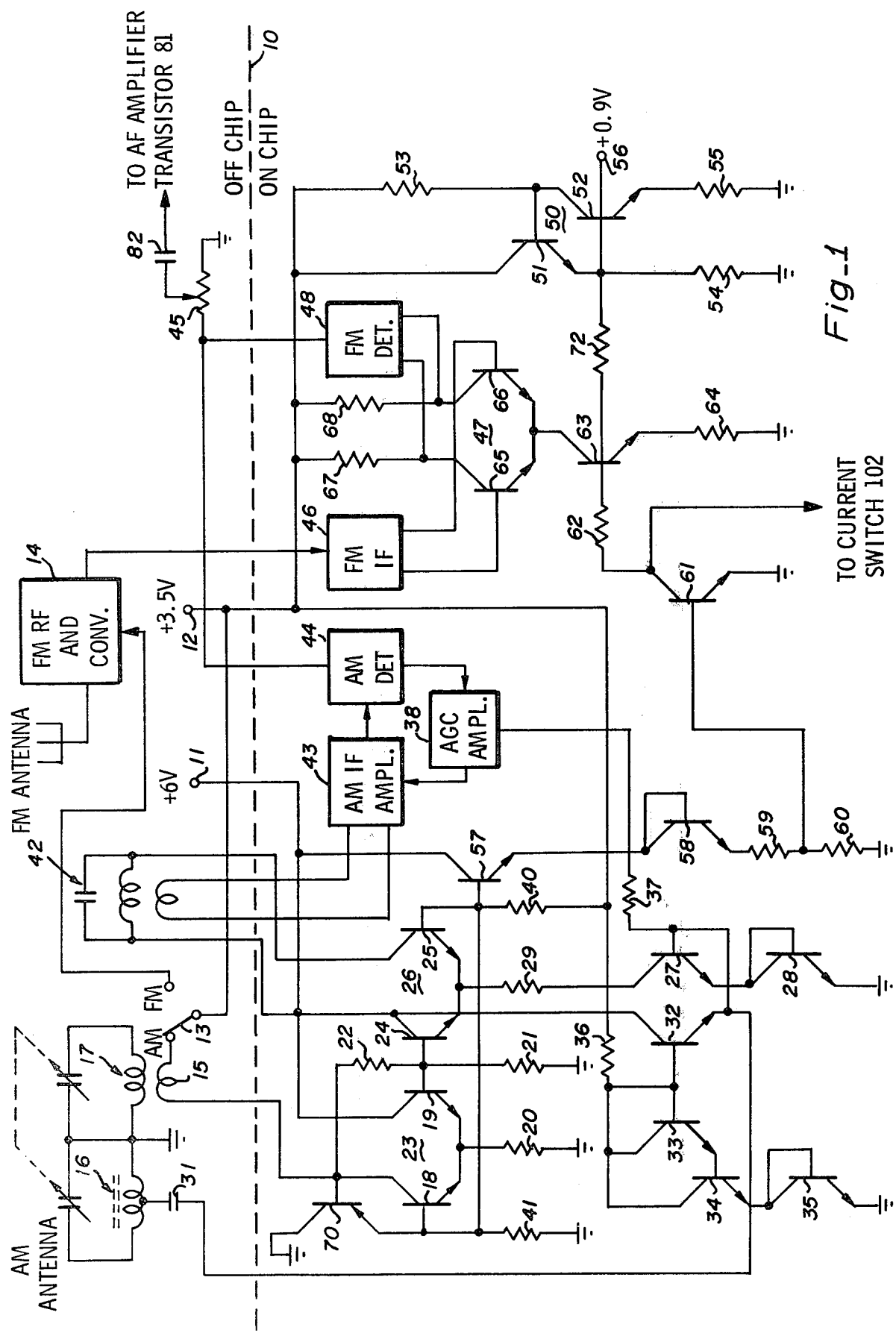
Fig_1

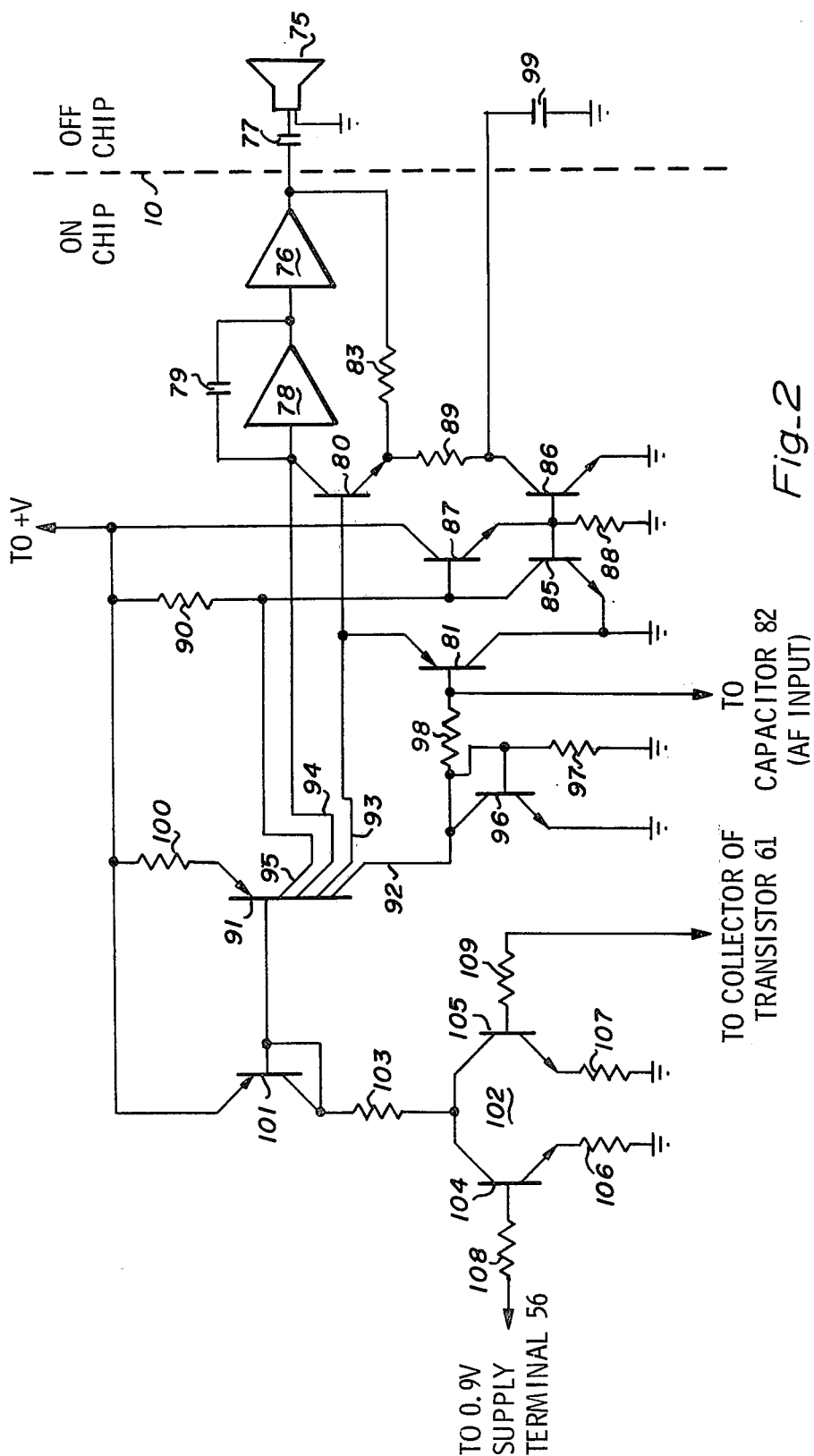
Fig_2

4,255,815

ELECTRONIC SWITCHING FOR AM-FM RADIO

BACKGROUND OF THE INVENTION

Integrated circuit (IC) devices have helped to reduce the complexity and size of radio receivers. In particular, AM-FM radios have benefited because virtually all of the active components can be contained in a single IC. A few off-chip mostly passive components are combined with the IC to provide a complete pocket sized AM-FM radio. The greatly reduced size has resulted in bringing the AM antenna, which is usually a ferrite core wire wound inductor, into close proximity with the loud speaker. In order to provide high fidelity (Hi Fi) FM performance, the audio system usually employs a broad band amplifier. Such devices have substantial gain out to about 15 kHz and in the AM broadcast band still have measurable response. When such an amplifier is employed in an AM radio, it can produce substantial audio signal related harmonic energy. While this energy is not heard, it can be radiated and picked up by the nearby AM antenna. Such signals appear in the receiver as noise and can seriously impair the AM radio sensitivity. One solution to this problem is to employ narrow band audio amplifiers, but this degrades the receiver's FM fidelity capability. Another solution is to employ special design amplifiers, usually employing filter circuitry to suppress AM radio noise. This approach is difficult to implement and often results in an unstable amplifier.

Another problem area is the AM-FM mode switching. Many prior art receivers employ a complex multiple-pole-double-throw switch. The various critical functions are simultaneously switched by what is, in effect, a multiple gang switch. Such devices are bulky, expensive and subject to failure. In addition, they often complicate the wiring pattern for the receiver.

SUMMARY OF THE INVENTION

It is an object of the invention to employ a simple single-pole-double-throw (SPDT) switch in combination with an IC to perform all of the band switching functions in an AM-FM radio receiver.

It is a further object of the invention to switch an FM-AM radio receiver using an IC to switch the AM-FM radio frequency (RF) components, and FM limiter in response to an SPDT switch.

It is a still further object of the invention to employ an IC audio amplifier that is switched between narrow and wide band modes in response to electronic switching in an AM-FM radio receiver.

These and other objects are achieved by the use of a SPDT switch which is manually operated to supply operating potential to an FM rf and converter section for FM or to the AM oscillator-mixer for AM. A switching circuit senses the state of AM oscillator-mixer and in turn switches the FM limiter and varies the bandwidth of the audio amplifier electronically.

BRIEF DESCRIPTION OF THE DRAWING

FIGS. 1 and 2 in combination disclose in schematic and block diagram form a complete AM-FM radio receiver with FIG. 2 showing the audio amplifier details. The schematic portions show the circuits critical to the invention, and the block diagram portions complete the receiver.

DESCRIPTION OF THE INVENTION

FIGS. 1 and 2 in combination show an AM-FM radio receiver circuit. Dashed line 10 separates the IC elements to show which are on chip and which are off chip. The schematic details show the critical circuitry and the block diagram completes the functional portions of the receiver. The circuits contained within the blocks are conventional and represent state of the art circuit practice.

Referring to FIG. 1, the circuits operate from a power supply connected between the +6 V terminal 11 and ground. While a 6-volt supply is shown, other values can be employed. Terminal 12 is shown being connected to a 3.5-volt supply. This will typically be achieved by incorporating a 3.5-volt regulator on chip and operating it from the 6-volt source. However, a separate regulator could be used.

The heart of the circuit is a simple single-pole-double-throw (SPDT) switch 13, which provides manual control over all of all electronic switching functions. The arm of switch 13 is connected to the +3.5 V supply line. In the FM position, +3.5 V is coupled to the FM r-f and converter circuitry, as shown in block 14. The switch is illustrated in the AM position and this function will be described first.

In the AM position of switch 13, +3.5 V is coupled through the coupling link 15 on the oscillator tank circuit 17 to the collector of transistor 18. Transistor 19 operates in conjunction with transistor 18 to create a differential oscillator 23. Resistor 20 acts as a tail current supply. Resistors 21 and 22 form a voltage divider across +3.5 V to bias up the base of transistor 19 and, therefore, sets the d-c operating level of the differential oscillator 23, which operates at the frequency set by tank circuit 17. Resistors 40 and 41 similarly bias up the base of transistor 18 from the 3.5 volt supply.

Transistors 24 and 25 are connected as a differential mixer 26. The bases of transistors 24 and 25 are connected in parallel with the bases of transistors 19 and 18, respectively. Transistor 27 controls the mixer 24 tail current, along with series connected diode 28 and resistor 29. Thus, the oscillator signal is differentially applied to the mixer. The AM r-f signal is applied to the base of transistor 27.

Antenna tank circuit 16 is typically a ferrite core wire wound loop, which develops an r-f signal by induction. The signal is coupled via capacitor 31 to the base of transistor 27. Oscillator tank 17 and antenna tank 16 are gang tuned as shown by the dashed coupling line on the variable capacitors. The tuning is designed to track so that the difference equals the intermediate frequency (IF) of the receiver.

The bias on transistor 27 is set up by transistor 32 which in turn is biased by transistor 34 in combination with diodes 33 and 35. Resistor 36 establishes a current in transistor 34 and diodes 33 and 35. Due to the presence of diode 33, the base of transistor 32 is thereby biased up 3 $V_{BE}$ above ground. Transistor 32 acts as a load element across the r-f input circuit (which sees the emitter resistance of an emitter follower stage). Resistor 37 couples an AGC sink current to the emitter of transistor 32 from AGC amplifier 38. For strong signals, where the AGC sink current is high, conduction in transistor 32 is increased, thereby increasing r-f input loading. At the same time, the conduction in transistor 27 is reduces so as to reduce the gain of converter 26.

Tank circuit 42 is tuned to the AM IF and comprises the load for converter 26. The IF signal is amplified by amplifier 43, and detector 44 provides an audio output that is coupled to volume control 45.

With the exception of the oscillator 23 and mixer 26 circuits, described above, the AM radio circuits are conventional. However, it should be pointed out that the IF and AGC circuits could be similar to those disclosed by Ronald W. Page in copending application Ser. number 851,014, filed November 11, 1977—, now U.S. Pat. No. 4,132,963—, and titled Gain Controlled Signal Amplifier.

In addition to the r-f and converter circuits in block 14 mentioned above, the FM portion of the receiver further includes FM IF amplifier 46, FM limiter 47, and FM detector 48, the latter of which is also coupled to volume control 45.

The IC further includes a bias regular 50 which typically develops a 0.9 volt potential at terminal 56. It can be seen that the base of transistor 51 is one $V_{BE}$ above the 0.9 volt level, therefore, resistor 53, which is coupled to the regulated 3.5 volt line, sets the current in transistor 52, and hence resistor 55. The voltage drop across resistor 55 plus the $V_{BF}$ of transistor 52 establishes the regulated voltage value at terminal 56. Resistor 54 acts as the load resistor for transistor 51.

In the AM mode, as determined by switch 13, it can be seen that transistor 57, which has its base connected to the bases of transistors 18 and 25, will be turned on so that current flows in diode 58 and resistors 59 and 60. This turns transistor 61 on which, by way of resistor 62, pulls the base of transistor 63 down to where it does not conduct. Transistor 63, along with resistor 64, controls the tail current in differential limiter 47, which is made up of transistors 65 and 66 with load resistors 67 and 68. With transistor 63 off, limiter 47 is off. Since the limiter is the last stage following the FN IF amplifier 46, the FM circuit is completely disabled and noise from this source is avoided.

When switch 13 is in the FM position, the +3.5V potential is no longer applied to the collector of transistor 18. Resistors 22 and 21 will pull the collector of transistor 18 toward ground and this action will turn transistor 70 on. Transistor 70, which was previously biased off, is a pnp grounded collector device that can be implemented as a parasitic element associated with transistor 18. In typical IC construction, a p type semiconductor substrate comprises the circuit ground or more negative potential point. An n type epitaxial layer grown thereon provides the layer in which the active transistors are frabricated. P type diffusions that extend completely through the n type expitaxial layer act to provide isolated pockets or tubs of n type material separated from the rest of the structure by a p n junction. When this junction is reverse biased, the tubs are electrically isolated and can contain one or more active devices that can then function independently. Typically, each tub includes a heavily doped buried layer or insert at the substrate-to-epitaxial layer interface. This provides a low resistance connection to the tub and tends to reduce parasitic effects. However, where a parasitic transistor is desired, as in the case of transistor 70, the buried layer is simply omitted. Thus, the collector of transistor 18 also comprises the base region of transistor 70, which operates against the substrate which is grounded to provide collector action. The p type diffused base region of transistor 18 then comprises the emitter region of transistor 70 can be implemented if desired as a parasitic element and a separate active device is not needed.

However, if desired, the buried layer under transistor 18 can be retained and transistor 70 implemented as a lateral device. In this structure the base of transistor 18 is employed as a lateral emitter to an adjacent p type diffused region. The intervening n type material, which comprises the lateral transistor base, is in fact the collector of transistor 18. Thus, a simple additional diffused region connected to the substrate will implement the collector of transistor 70.

As resistors 21 and 22 pull the base of transistor 70 toward ground the emitter follows and the bases of transistors 18 and 19 will both be pulled down toward ground. Thus, oscillator 23 will be turned off by current flow in transistor 70. Since mixer 24 is biased from the same circuit, it too will be turned off. In addition, transistor 57, which has its base also coupled to the emitter of transistor 70, will be turned off. Thus, the operation of the single-pole switch 13 turned one transistor on and five other transistors off. This action stops conduction in resistor 60 so that transistor 61 is also turned off.

With transistor 61 off, resistor 72 will pull the base of transistor 63 up toward the 0.9 volt potential of regulator 50. This turns limiter 47 on and, since switch 13 applied +3.5V to the FM RF and converter circuits 14, the FM receiver portion is active while the AM portion is disabled.

From the foregoing, it can be seen that the complicated switching required to operate the plural FM-AM switching functions is achieved using on chip circuitry actuated by a simple SPDT switch 13.

The switch functions described above are further used to control the audio portion of the receiver shown in FIG. 2 which will now be described.

The output transducer, shown as speaker 75, is coupled to a power amplifier 76 via capacitor 77. A high gain inverting amplifier 78 drives power amplifier 76 and a feedback capacitor 79 makes the input into amplifier 78 a low impedance reactive load for transistor 80.

The presence of capacitor 79 across the inverting amplifier 78 makes the input to amplifier 78 a constant voltage. Thus, transistor 80 operates as a current supply looking into a very low impedance. Since capacitor 79 has a well-defined capacitance, the collector current of transistor 80, in combination with capacitor 79, will establish a well-defined gain versus frequency characteristic for the amplifier section. Since the impedance is capacitive, the amplifier has a gain roll-off close to 6 db per octave.

The combination of amplifiers 76 and 78 with transistor 80 creates a differential audio amplifier. The base of transistor 80 comprises the non-inverting input which is coupled to the volume control 45 by means of emitter follower transistor 81 and capacitor 82. The emitter of transistor 80 comprises the inverting input, which is coupled to the amplifier output by resistor 83 to provide negative feedback. The negative feedback at dc is 100%, while the ac feedback is set by the ratio of resistors 83 and 89. Capacitor 99 acts as a signal bypass at the collector of transistor 86.

The audio amplifier is biased by multiple collector transistor 91 in combinatin with a current mirror comprising transistors 85–87. Collectors 93–95 are made to have the same size and hence pass equal currents which are used to supply operating currents to transistors 81, 80, and 85, respectively. If transistors 85–87 all are of the same area, the current supplied to transistor 86 will equal the current supplied to transistor 85. Emitter follower transistor 87, along with resistor 88, compensates the base currents in transistors 85 and 86 and provides for high accuracy in the current mirror.

Resistor 90 provides a current increment to transistor 85 in addition to the current from collector 95. This same increment is reflected into the collector current of transistor 86. Since the collector of transistor 80 is supplied by collector 94, the current increment from resistor 90 must also flow as mirrored current in resistor 83, which is returned to the output of amplifier 76. It should be noted here that resistor 89 is small enough in value that it has little effect upon the operating currents.

Since the same currents are forced in resistors 83 and 90, if 83 is made to have one half of the value of resistor 90, the output voltage of amplifier 76 will be foreced to one half of +V. Thus, the quiescent circuit bias is simply determined by the ratio of resistors 83 and 90.

Collector 92 of transistor 91 is typically made about five times the size of any one of the other collectors which forces about five times the current in diode 96. This in turn establishes the operating bias of the base of transistor 81 by way of resistor 98. Thus, the base of transistor 81 comprises a high impedance audio signal input for the audio amplifier portion of the receiver.

Since transistor 80 is working into a low impedance load, the frequency versus gain characteristic of the amplifier is a function of the current flowing in transistor 80. The higher the current the greater will be the audio amplifier bandwidth. Thus, the audio bandwidth will be proportional to the current flowing in transistor 91 and controllable.

Transistor 91 has its base coupled to diode 101 and its emitter is returned to +6V through resistor 100. Thus, a current mirror action is available to control the current in transistor 91. Diode 101 is coupled via resistor 103 to adder 102, which comprises transistors 104 and 105. Transistor 104 is biased from the 0.9 volt supply via resistor 108 and transistor 105 is biased via resistor 109 from the collector of transistor 61. Thus, it can be seen that in the AM mode only transistor 104 will conduct. In the FM mode both transistors 104 and 105 will conduct. The conduction of adder 102 for AM will be set by resistor 106 and the additional current in FM will be set by resistor 107.

In practice, the current in the FM mode is established to give the audio response a wide band or high fidelity characteristic. In the AM mode the audio bandwidth is reduced so that the audio amplifier gain rolls off to produce substantially zero signal output in the standard broadcast band. As mentioned above, since the standard AM broadcasts have limited fidelity because of the nature of the service, the reduced audio bandwidth does not seriously degrade performance. Yet the rf noise content of the audio output can be greatly reduced.

EXAMPLE

The receiver shown in FIGS. 1 and 2 was constructed using standard bipolar monolithic IC components. The various indicated components values were selected as follows.

| COMPONENT | VALUE | COMPONENT | VALUE |
| --- | --- | --- | --- |
| Resistor 20 | 7K ohms | Resistor 68 | 1K ohms |
| Resistor 21 | 6.2K ohms | Resistor 72 | 5.1K ohms |
| Resistor 22 | 2K ohms | Capacitor 79 | 10 picofarads |
| Capacitor 31 | 0.1 microfarad | Capacitor 82 | 10 microfarads |
| Resistor 36 | 5.1K ohms | Resistor 83 | 12K ohms |
| Resistor 37 | 500 ohms | Resistor 88 | 5.1K ohms |
| Resistor 40 | 2K ohms | Resistor 89 | 100 ohms |
| Resistor 41 | 6.2K ohms | Resistor 90 | 24K ohms |
| Potentiometer 45 | 10K ohms | Resistor 97 | 300K ohms |
| Resistor 53 | 8.2K ohms | Resistor 98 | 140K ohms |
| Resistor 54 | 3K ohms | Capacitor 99 | 100 microfarads |
| Resistor 55 | 1K ohms | Resistor 100 | 1K ohms |
| Resistor 59 | 2K ohms | Resistor 103 | 1.8K ohms |
| Resistor 60 | 10K ohms | Resistor 106 | 4.4K ohms |
| Resistor 62 | 2.8K ohms | Resistor 107 | 2K ohms |
| Resistor 64 | 1K ohms | Resistor 108 | 1.3K ohms |
| Resistor 67 | 1K ohms | Resistor 109 | 400 ohms |

The receiver circuits functioned as intended and the FM audio bandwidth was about 15 kHz. In the AM mode, the audio bandwidth was about 7 kHz, which substantially reduced the AM antenna noise pickup due to AF output coupling.

The invention has been described and a working embodiment detailed. Clearly, there are alternatives and equivalents that are with the spirit and intent of the invention. For example, the circuit could be partitioned on two or more IC chips or additional circuitry could be integrated into a single chip. Also, while a mechanical SPDT switch is shown, the electronic equivalents could be employed. For example, opto electronic or touch or proximity switching could be used in place of switch 13. Accordingly, it is intended that the invention be limited only by the claims that follow.

We claim:

1. An integrated circuit for performing the signal processing functions of a radio receiver capable of operating on amplitude modulated (AM) and frequency modulated (FM) standard broadcast signals, said receiver comprising an AM signal antenna, an FM signal antenna, intermediate frequency (IF) amplification means, FM amplification and converter means, audio frequency (AF) amplifier means, and single pole means for switching the operation of said receiver between said AM and FM signals, said circuit comprising:

means for converting signals from said AM signal antenna to an IF signal and means for coupling said IF signal to said IF amplification means;

means responsive to said switching means for disabling said means for converting when said switching means is in the FM function;

limiting amplifier means coupled to said IF amplification means and operative to provide signal limiting action on said FM signals;

means responsive to said switching means for disabling said limiting amplifier means when said switching means is in the AM function;

audio amplifier means for amplifying both said AM and FM audio signals; and;

means responsive to said switching means for reducing the bandwidth of said audio amplifier means when said switching means is in the AM function, wherein said audio amplifier means comprise:

a high gain inverting amplifier portion having a capacitor coupled between the input and output terminals thereof;

a variable current driver portion coupled to said input terminal of said high gain inverting amplifier whereby the bandwidth of said audio amplifier is proportional to the current in said variable current driver; and means for varying the current in said variable current driver as a function of said means for switching.

* * * * *